United States Patent
Li et al.

(10) Patent No.: US 6,928,600 B2
(45) Date of Patent: Aug. 9, 2005

(54) FOLDING SYSTOLIC ARCHITECTURE FOR COMMA-FREE REED-SOLOMON DECODING CIRCUIT

(75) Inventors: Chi-Fang Li, Taichung Hsien (TW);
Wern-Ho Sheen, Chia I Hsien (TW);
Yuan-Sun Chu, Chia I Hsien (TW);
Jan-Shin Ho, I Lan Hsien (TW);
Yuan-Tzu Ting, Hsinchu (TW)

(73) Assignee: Chung Shan Institute of Science and Technology, Taochun (TW)

( * ) Notice: Subject to any disclaimer, the term of this patent is extended or adjusted under 35 U.S.C. 154(b) by 465 days.

(21) Appl. No.: 10/122,185

(22) Filed: Apr. 16, 2002

(65) Prior Publication Data
US 2003/0196162 A1 Oct. 16, 2003

(51) Int. Cl.⁷ .............................................. H03M 13/33
(52) U.S. Cl. .................................... 714/775; 714/784
(58) Field of Search .................................. 714/775, 784, 714/798

(56) References Cited

U.S. PATENT DOCUMENTS 5,630,154 A * 5/1997 Bolstad et al. ............... 712/19
6,363,060 B1 * 3/2002 Sarkar ........................ 370/342
6,504,830 B1 * 1/2003 Ostberg et al. ............... 370/342
6,587,852 B1 * 7/2003 Svingen et al. ............... 707/6
6,665,277 B1 * 12/2003 Sriram ........................ 370/324
6,675,187 B1 * 1/2004 Greenberger ............... 708/622
6,731,673 B1 * 5/2004 Kotov et al. ................. 375/145

* cited by examiner

Primary Examiner—Stephen M. Baker
(74) Attorney, Agent, or Firm—Birch, Stewart, Kolasch & Birch, LLP

(57) ABSTRACT

A kind of folding systolic array architecture for a CFRS decoding circuit that applies to a cell search in a wideband code division multiple access system. The invention involves using a systolic array for its decoding circuit and using a kind of folding technology to reduce the area of the systolic array. The systolic array for the decoding circuit comprises an input pattern generator, a processing element array designed in the form of a systolic array and a boundary processing element array. Given the skewed-form output results required by the systolic array and generated by the input pattern generator, the processing element array makes a set of correlating comparisons, and outputs the results of the correlating comparisons to the boundary processing elements, so as to acquire the decoding results required by the CFRS decoding. The results indicate the frame boundary and scrambling code groups of the cell search in a wideband code division multiple access system.

6 Claims, 12 Drawing Sheets

| Folding time(s) | Array size | Decoding latency |
|---|---|---|
| 0 | 64x15 | 94 |
| 1 | 32x15 | 94 |
| 2 | 16x15 | 94 |
| 3 | 8x15 | 142 |
| 4 | 4x15 | 258 |
| 5 | 2x15 | 496 |
| 6 | 1x15 | 975 |

TABLE.1

| Components of Decoder / Decoder Architecture | IPG | PE | BPE | PE array | BPE array | Array Controller | Refresh circuit | Total gate-count | Decoding Latency |
|---|---|---|---|---|---|---|---|---|---|
| 64x15 Systolic Array Decoder | 810 | 21 | 184 | 20,160 | 11,776 | | | 32,746 | 94 |
| Folding 16x15 Decoder | 810 | 21 | 184 | 5,040 | 2,944 | 777 | 3,447 | 13,018 | 94 |
| Folding 1x15 Decoder | 810 | 21 | 195 | 315 | 195 | | | 1,320 | 975 |
| Folding 16x15 & 1x15 Decoder | 810 | 21/25 | 195/184 | 315 + 5,625 | 195 + 2,760 | 777 | 3,447 | 14,318 | 94 |
| Folding & Weighted 16x15 Decoder | 2,527 | 109 | 286 | 26,160 | 4,576 | 777 | 3,447 | 37,487 | 94 |

TABLE.2

FOLDING SYSTOLIC ARCHITECTURE FOR COMMA-FREE REED-SOLOMON DECODING CIRCUIT

FIELD OF THE INVENTION

The invention generally relates to a Comma-Free Reed-Solomon decoding circuit and method that applies to a cell search in a wideband code division multiple access (W-CDMA) system, and more particularly relates to a Comma-Free Reed-Solomon decoding circuit that employs a folding systolic array circuit structure.

BACKGROUND OF THE INVENTION

For the third generation partnership project (hereinafter referred as the 3GPP) wideband code division multiple access (hereinafter referred as W-CDMA) system, the cell search process employed by a cellular phone has to execute a series of detections and testing procedures of synchronization codes in order to synchronize the cellular phone with its best base station. In general, the cell search algorithm of the 3GPP W-CDMA is divided into three ordered steps: 1) slot synchronization, 2) frame synchronization and code-group identification, and 3) scrambling-code determination. The first step involves using a primary synchronization code (hereinafter referred as PSC) to achieve slot synchronization. The second step involves using both the secondary synchronization codes (SSCs) and the Comma-Free Reed-Solomon (hereinafter referred as CFRS) codes to achieve frame synchronization and code-group identification. The third step involves using all the possible scrambling codes of the identified code group to execute a de-scrambling procedure for scrambling-code determination. Before achieving the synchronization, the cellular phone cannot begin to decode various channel messages broadcasted by the base station or measure various channel effects.

In this invention, we are concerned with the second step of the synchronization procedure, which involves decoding the CFRS code so as to determine the frame boundary and code group. The CFRS code is a Comma-Free code and Reed-Solomon code and thus it has the features of both. The Comma-Free code has a feature that no new Comma-Free codeword can be created by combining any two Comma-Free codewords. It is capable of being used for both error detection and synchronization simultaneously. The synchronization capability of a Comma-Free code is used by 3GPP W-CDMA to achieve frame synchronization. Generally, a Comma-Free code decoding circuit is composed of simple correlators. However, in 3GPP W-CDMA, the Comma-Free code is transmitted intermittently as opposed to the continual transmission used in other applications. Therefore, an ordinary Comma-Free code decoder is not applicable to the synchronization procedure of the 3GPP W-CDMA.

The CFRS code is a (15, 3) Reed-Solomon (hereinafter referred as RS) code with a powerful error correction capability that is essential to 3GPP W-CDMA. The design of a RS decoder has been discussed in detail in many articles, and the most widely used decoding method can be described as having four steps: 1) syndrome calculation of the received codeword, 2) error locator polynomial and error evaluator computations, 3) error location calculation, and 4) error value calculation. However, in 3GPP W-CDMA, the set of CFRS codes is composed of 64 special RS codes and thus an ordinary RS decoder is unsuitable.

3GPP W-CDMA uses 64 CFRS codes to represent 64 code groups. Each codeword consists of 15 symbols. Every code group includes eight scrambling codes. Every base station treats one of the eight scrambling codes of the code group to which it belongs as its scrambling code for differentiating itself from the other stations. To be connected through a certain base station, a cellular phone has to achieve scrambling code synchronization with the base station first. As described above, the synchronization process has to include a decoding procedure of a CFRS code for frame boundary detection and code-group determination.

The symbols of the CFRS code are chosen from the elements of Galois Field (GF) (16). Among the 16 secondary synchronization codes transmitted via a secondary synchronization channel, an nth cyclic-shift synchronization code represents that the nth code symbok, an element of GF (16), is regarded as the first code symbol. Symbols are selected to form 64 CFRS codes to represent 64 code groups. To transmit the CFRS codes, a base station sends identical codes in each frame. However, prior to frame synchronization, the assumed initial position for the receipt of CFRS codes is not necessarily occupied by the first code symbol, but can be occupied by any one of the 15 code symbols. Since the same CFRS code is transmitted in each frame, it is possible to receive 15 code symbols continuously even before a frame boundary is determined. The consecutive received 15 code symbols correspond to a cyclic-shift version of a CFRS codeword. The aim of decoding is to identify the received codeword as one of the 64 CFRS codes in order to determine the code group, and to detect the cyclic-shift amount so as to determine the frame boundary.

According to the above description, there are 64 CFRS codes and 15 cyclic-shift versions of each codeword. Thus there can be a total of 960 (64×15) versions of cyclic-shift codeword. The evaluation of these 960 cyclic-shift hypotheses requires a lot of complicated calculations, and more importantly, timely accomplishment of these calculations in order to avoid delay in the synchronization procedure that would cause more serious problems. Hence, decoding speed has a direct impact on real-time synchronization. A "fast" CFRS decoder is an indispensable component for the cell search algorithm.

The decoding methods discussed in the existing literature regarding cell search algorithms merely involve direct comparison of these 960 versions, thus there is no optimal decoding method, nor is there any optimal architecture for hardware implementation. Therefore, it is a good idea in implementing the direct decoding method based on the 960 versions to develop decoding hardware architecture that works optimally, as well as to put forward a decoding method that is optimal.

SUMMARY OF THE INVENTION

In view of the aforesaid technical problems, the invention provides a kind of speedy decoding circuit architecture that applies to the CFRS code of 3GPP W-CDMA, not only to support various kinds of cell search algorithms, but also to meet the demand for frequent decoding in multi-candidate cell search algorithms.

In the cell search procedure of the 3GPP W-CDMA, there are many options for an execution strategy. For example, serial execution of the three steps of the synchronization procedure, simultaneous execution of the synchronization procedure in a pipelined manner, or selecting several slot boundary candidates in step 1 and simultaneously executing steps 2 & 3 by means of the various slot boundary candidates; are all possible and feasible. Each algorithm produces a different CFRS decoding speed. Serial cell search does not produce fast decoding. Pipelined cell search produces a decoder with high decoding speed. The multi-candidate method produces a decoder with extremely high decoding speed meeting the need for frequent decoding. The invention provides the means to provide all the aforesaid arrangements, i.e. providing decoding circuits that work at high or low decoding speeds. Whenever a high decoding speed is required, it meets the decoder requirements of the cell search algorithm. Whenever a low decoding speed is acceptable, it executes decoding with the minimal number of components so as to reduce power consumption.

Another object of the invention is to provide a kind of folding systolic array (SA) architecture for a CFRS decoding circuit. This kind of architecture is able to perform speedy real-time execution of decoding synchronization.

In addition, the invention employs a folding technique in the SA architecture to reduce the area of its array without jeopardizing its speedy decoding feature. Furthermore, the incorporation of the folding concept into the design of a decoding circuit balances decoding speed with hardware cost, meeting various demands for cell search algorithms with minimum hardware cost and power consumption.

To gain further insight into the characteristics and the implementation of the invention, illustrations and detailed explanation of the preferred embodiment are provided below:

Table 1 shows the array sizes and the decoding duration that result front the application of the folding technology; and Table 2 shows the comparison of the gate-count required by individual types of architecture.

DETAILED DESCRIPTION OF THE PREFERRED EMBODIMENT

Figure 1:
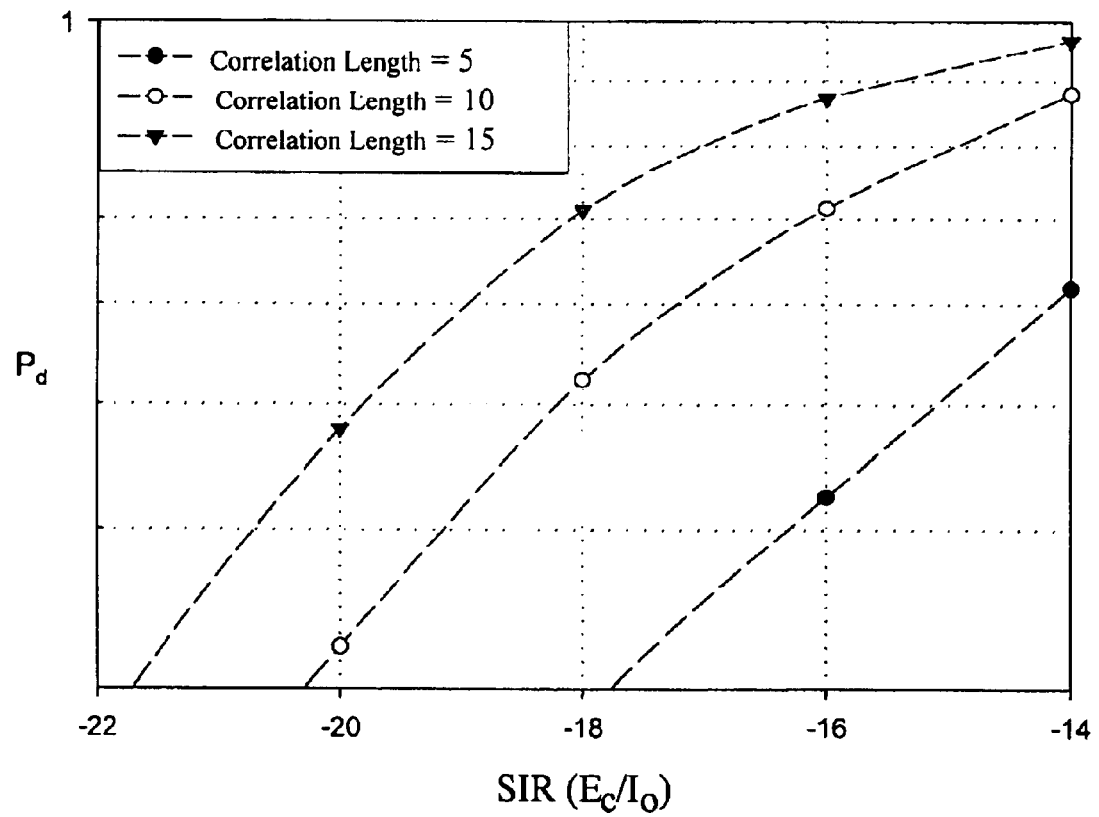
FIG. 1 depicts the comparison of the efficiency of CFRS decoding in different decoding lengths.

As shown in FIG. 1, the 960 versions of CFRS codes can be decoded better with a complete set of 15 code symbols rather than with part of the code symbols. Hence, in the invention, after 15 code symbols have been received, a frame boundary is determined by making reference to a direct comparison of the 15 code symbols.

In order to achieve the objects of the invention, the invention puts forward a kind of folding technique and builds a decoding circuit with a folded SA architecture. Explanation will be first given on the decoding circuit based on a SA architecture, then, explanation will be given on the folding technique and the SA-based decoding circuit to which this technique applies. Finally, extension of the folding technique will be discussed.

The decoding method adopted by the invention can be denoted in the following way:

$$(i, j) = \text{Arg}\{\max\{X_i \otimes H_j\}_{j=0\sim63}^{i=0\sim14}\} \quad (1)$$

where i denotes the index for the 15 cyclic-shift versions, j denotes the index for the 64 CFRS codes, $X_i$ denotes the result of i time(s) of rightward cyclic-shift of the received CFRS codes, while $X_0$ denotes the result of arbitrary cyclic-shift of the CFRS codes received in the beginning; and, $X_i = \{x_1, x_2, x_3, \ldots, x_{15}\}, x_k \in GF(16), 1 \leq k \leq 15$. $H_j$ denotes one of the 64 CFRS codes, and $H_j = \{h_1, h_2, h_3, \ldots, h_{15}\}, h_k \in GF(16), 1 \leq k \leq 15$. Finally, $X_i \otimes H_j$ refers to making a correlating comparison.

I. SA-based Decoding Circuit

Figure 2:
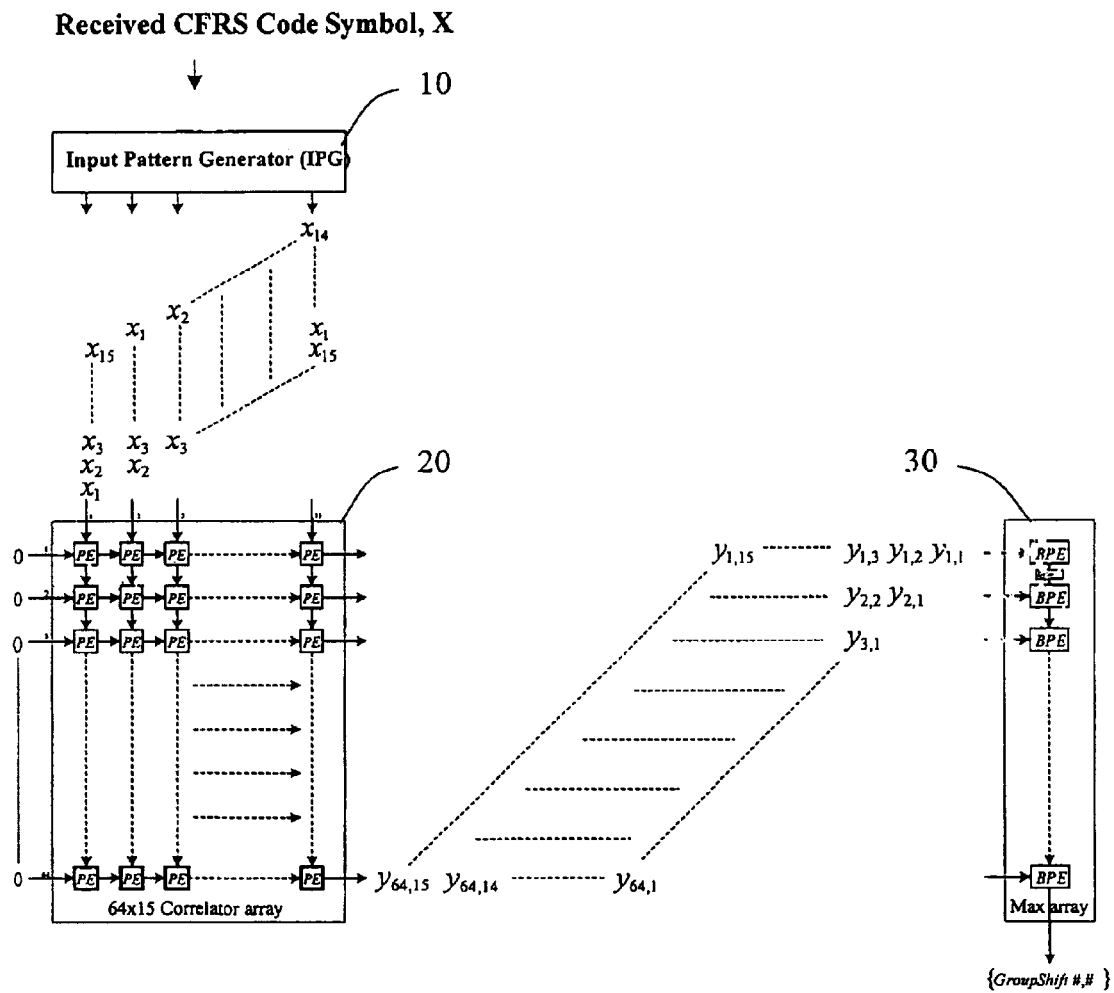
FIG. 2 shows a CFRS decoder based on SA architecture, wherein x, denotes the received code symbol and $y_{j,i}$ denotes the result of a correlating comparison.

As shown in FIG. 2, the decoding circuit comprises several components, namely an Input Pattern Generator (IPG) 10, a 64×15 Processing Element Array (PEA) 20, and a 64×1 Boundary Processing Element Array (BPEA) 30.

Figure 3:
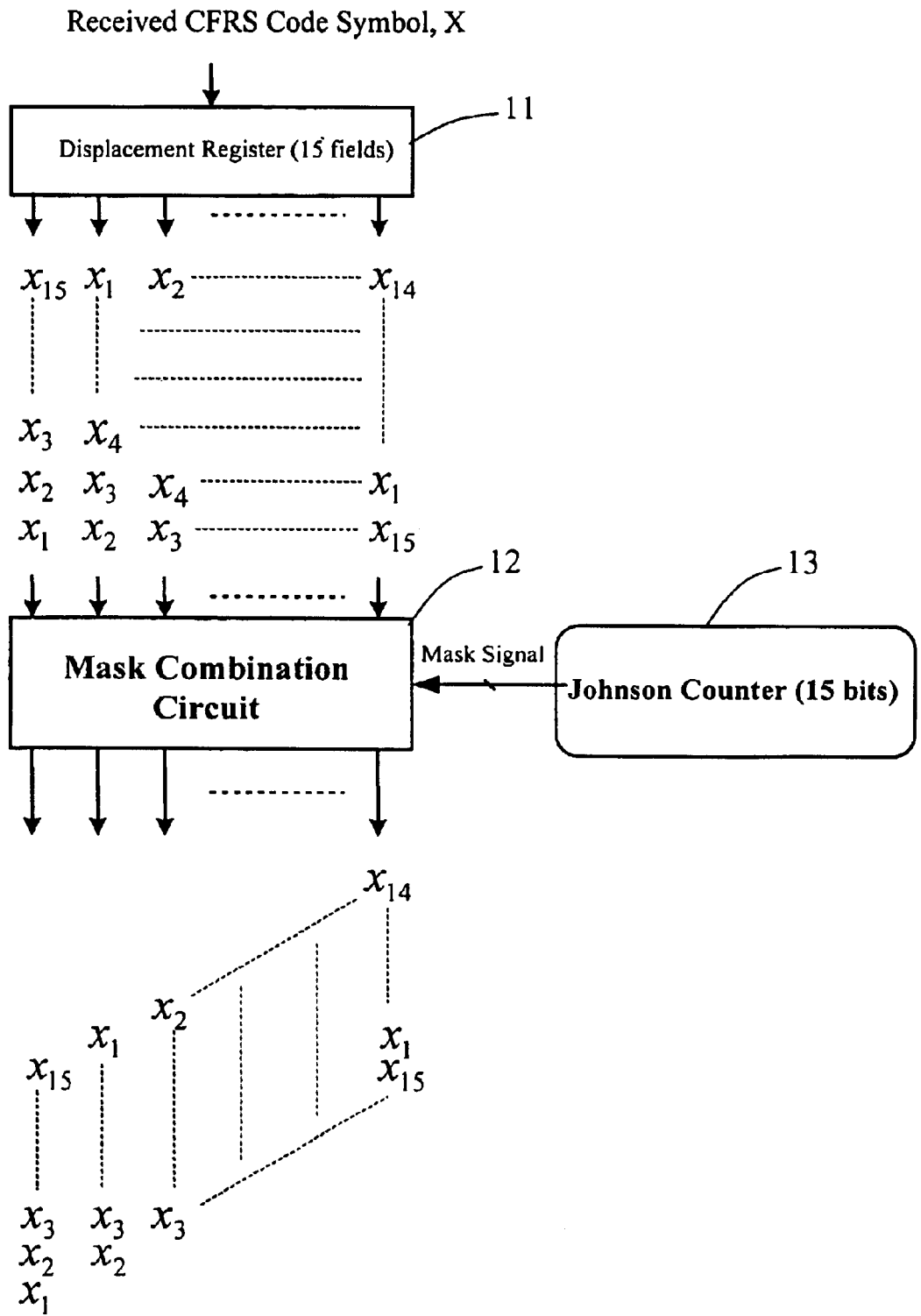
FIG. 3 depicts the structure of IPG.

The main function of the IPG 10 is to generate 15 cyclic-shift versions from the arbitrary cyclic-shift version CFRS codes received, X, wherein $X_i$, $0 \leq i \leq 14$, then input the cyclic-shift versions to the PEA 20 in a skewed form required by the SA architecture, such that the input comprises all the 15 cyclic-shift versions. As shown in FIG. 3, its circuit structure comprises a shift register 11, a Johnson counter 13, and a masking combinational circuit 12. Its process is described below.

First of all, a received code, X, is loaded to the shift register 11. The shift register 11 then generates its 15 versions of cyclic-shift separately. The Johnson counter 13 generates the required skewed mask. With the masking combinational circuit 12, the 15 cyclic-shift versions are turned into the required 15 cyclic-shift versions in skewed form. The skewed 15 cyclic-shift versions of X are input to the underlying WPEA 20 that is based on a SA architecture.

Figure 4:
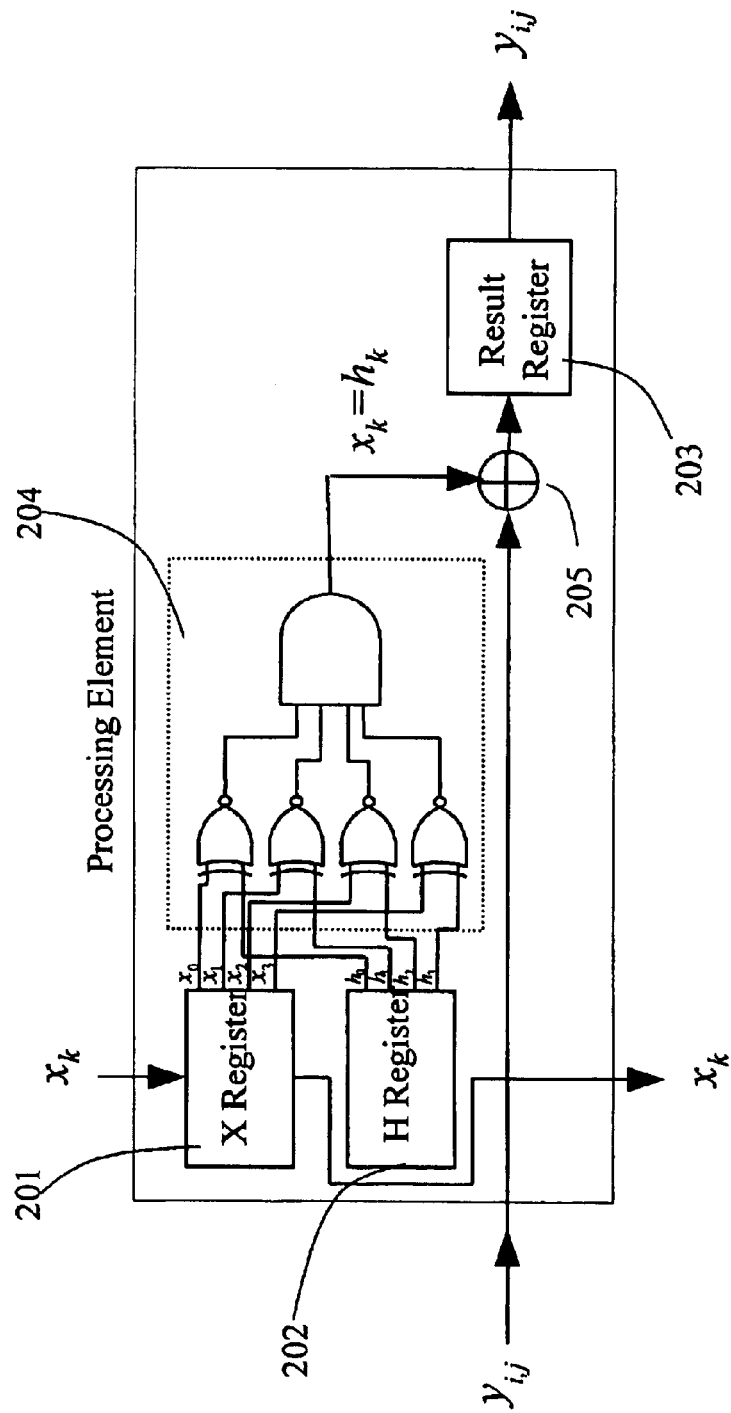
FIG. 4 depicts the circuit of PE.

The PEA 20 is a kind of SA architecture composed of 64×15 PEs. The structure of each PE is shown in FIG. 4, and the primary function of the PE is to make a correlating comparison. IPG 10 generates all the 15 cyclic-shift versions that are then compared with 64 sets of CFRS codes for correlations. There are three registers in each PE: H register 202, X register 201 and Y register 203. The H register 202 is for storing the code symbols, $h_k$, of CFRS code beforehand, or, in other words, the 64×15 CFRS code symbols table 40 shown in FIG. 5 is put in the H register 202 of every PE of the 64×15 PEA 20 correspondingly. Since there are 64 CFRS codes, and each codeword consists of 15 code symbols, without folding, the 15 versions need to be processed by a 64×15 PEA 20. The X register 201 is for storing the code symbols, $x_k$, sent by the overhead PE. Given the comparing combinational circuit 204 shown in FIG. 4, when the two code symbols stored in the X register 201 and the H register 202, respectively, are identical, an accumulator 205 accumulates the result of the correlating comparison and stores the result in the Y register 203 first. It then sends the result to the PE on its right and sends the received code symbols $x_k$ to the underlying PE.

Figure 6:
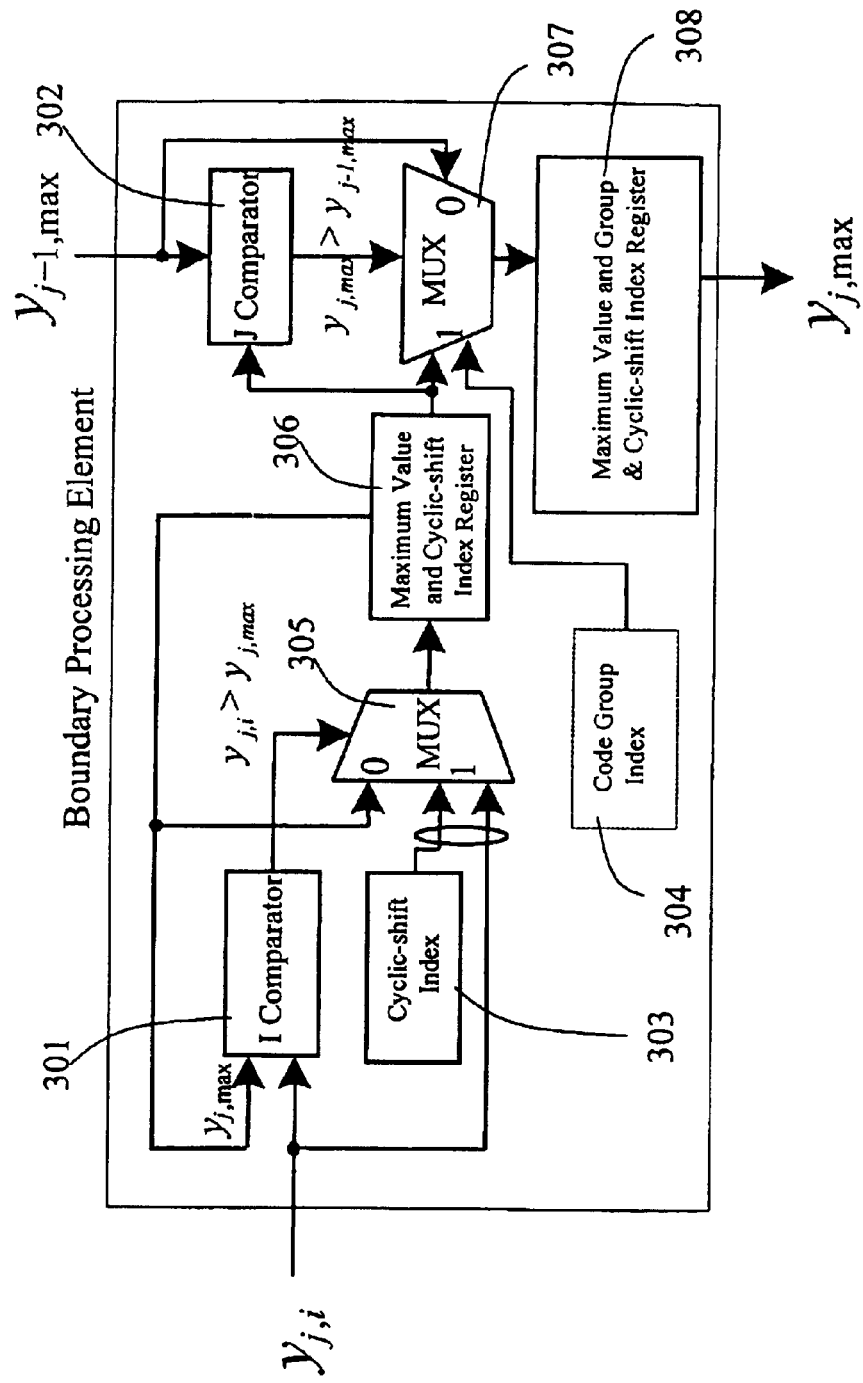
FIG. 6 depicts the circuit of BPE.

The 64×15 PEA 20 connects to a 64×1 BPEA 30 that lies on its right. Each row of the PEA 20 is in charge of making the correlating comparison with a particular CFRS codeword. The last PE output of each row is the result of correlating comparison, $y_{j,i}$. BPE compares this set of comparison results, $y_{j,i}$ for i=0–14. After comparing the 15 cyclic-shift results of the same codeword, each BPE begins to compare the results of individual rows as shown in FIG. 6.

The I comparator 301 is for comparing the results of the same row. A result that is greater is stored in the maximum value and cyclic-shift index register 306 first. After the maximum result of the same row has been generated, the J comparator 302 begins to compare the maximum value of the existing row with that of the overhead row. It selects the greater one, saves it and its code group index j and cyclic-shift index i in the maximum value and group & cyclic-shift index register 308, and sends them to the underlying BPE. The multiplexer 305 makes reference to the result of the I comparator 301, and saves the greater result value, $y_{j,i}$, and its cyclic-shift index i in the maximum value and cyclic-shift index register 306. In the event that the new $y_{j,i}$ value is greater than the $y_{j,max}$ value, that is, when the multiplexer 305 chooses line 1, then its cyclic-shift index i is provided by the cyclic-shift index 303. The multiplexer 307 makes reference to the result of J comparator 302, and saves the greater result value, $y_{j,i}$, its cyclic-shift index i and code group index j, etc., in the maximum value and group & cyclic-shift index register 308. In the event that the result of the existing row, $y_{j,max}$, is greater than the $y_{j-1,max}$ value of the overhead row, then its group index is provided by the code group index 304.

The output of the BPE at the bottom (that is, the output result of the maximum value and group & cyclic-shift index register 308) is the result of decoding. The comparison result indicating the greatest correlation is the desired decoding result. The code group index j of this result denotes that the received CFRS code, X, is the $j^{th}$ code of all the possible 64 CFRS codes, while the cyclic-shift index i denotes that the received CFRS code, X, results from i symbols of cyclic-shift of the original code symbol. As described in the "Background of the Invention" section of this document, in 3GPP W-CDMA, the code group index, j, denotes a code group, while the cyclic-shift index, i, denotes a frame boundary. This is the end of step 2 of the cell search.

Referring to FIG. 2 again, the whole decoding procedure is: load the CFRS codes received to IPG 10; the IPG 10 generates 15 cyclic-shift versions in order; input the 15 versions of cyclic-shift in skewed style to the 64×15 PEA 20; the PEA 20 makes a correlating comparison between the 15 types of cyclic-shift and 64 sets of codes saved beforehand; a comparison is made on each row with respect to one possible CFRS code; for the comparison result of a row, the BPE of the row identifies the most probable cyclic-shift; search vertically, that is, from the top to the bottom, and find the greatest correlation result of cyclic-shift of individual rows; the output of the BPE at the bottom is the decoding result.

The decoding duration required by this decoding circuit is as follows: (Please refer to the aforesaid decoding process) 15 cycles after the IPG 10 has input the skewed-form cyclic-shift versions into the PEA 20, the first correlating comparison result of the first row is generated; 14 cycles later, the last correlating comparison result of the first row is generated; one cycle later, the most possible cyclic-shift version of the first row is generated and, meanwhile, the last correlating comparison result of the second row has been generated, thus the BPE of the second row only generates the most probable cyclic-shift of the second row and begins to compare the results of individual rows vertically after one more cycle. It takes 63 cycles to generate the final result. Therefore, a total of 15+14+1+1+63=94 cycles is required to finish decoding. The length of each cycle varies according to the implementation method.

From the point of view of a system, the chip rate is 3.84 MHz. In general, the minimum frequency designed by a circuit should be 3.84 MHz. In other words, the designed circuit only spends time for a maximum 94 chips on decoding. Thus, there is sufficient time to prepare for the following step of determining scrambling codes in an ordinary synchronization procedure. Even if decoding has to be executed ten or twenty times in multi-candidate cell search algorithms, this decoder is able to finish decoding before the end of the slot wherein the $15^{th}$ secondary synchronization code is decoded. Thus it does not delay the execution of step 3 of the cell search procedure. The total time spent: 20 (number of times of decoding)*94 (the duration of decoding)+256 (receipt of the secondary synchronization code)=2136<2560 (slot length).

Figure 5A:
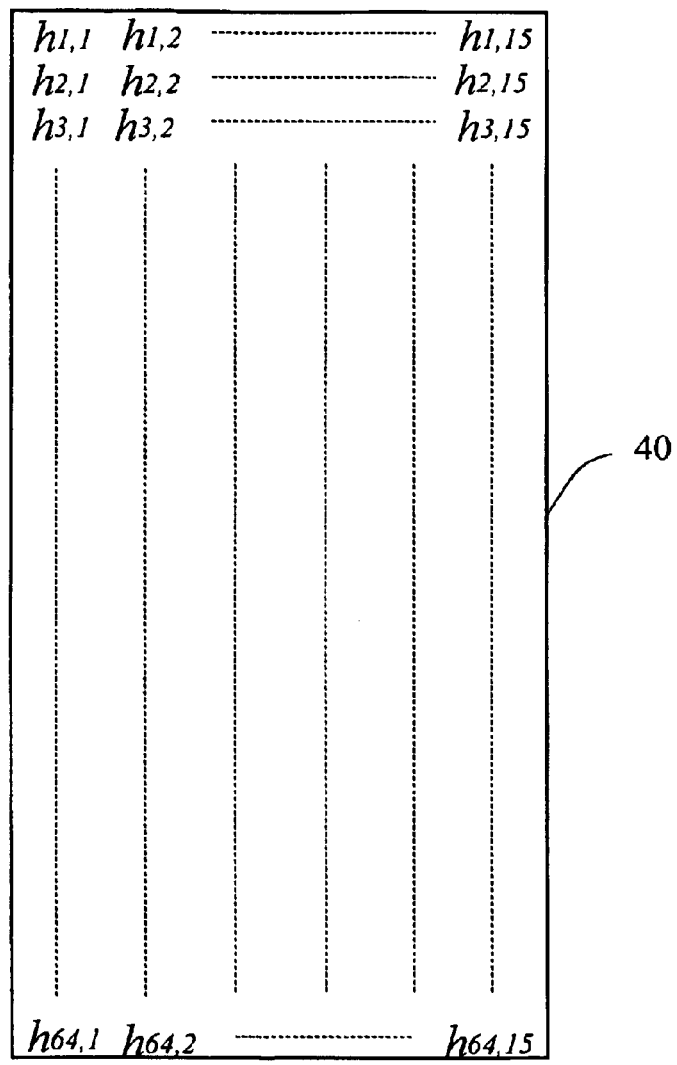
FIGS. 5A–5C show the table of 64 CFRS codes and the table of its segments after folding.
Figure 5B:
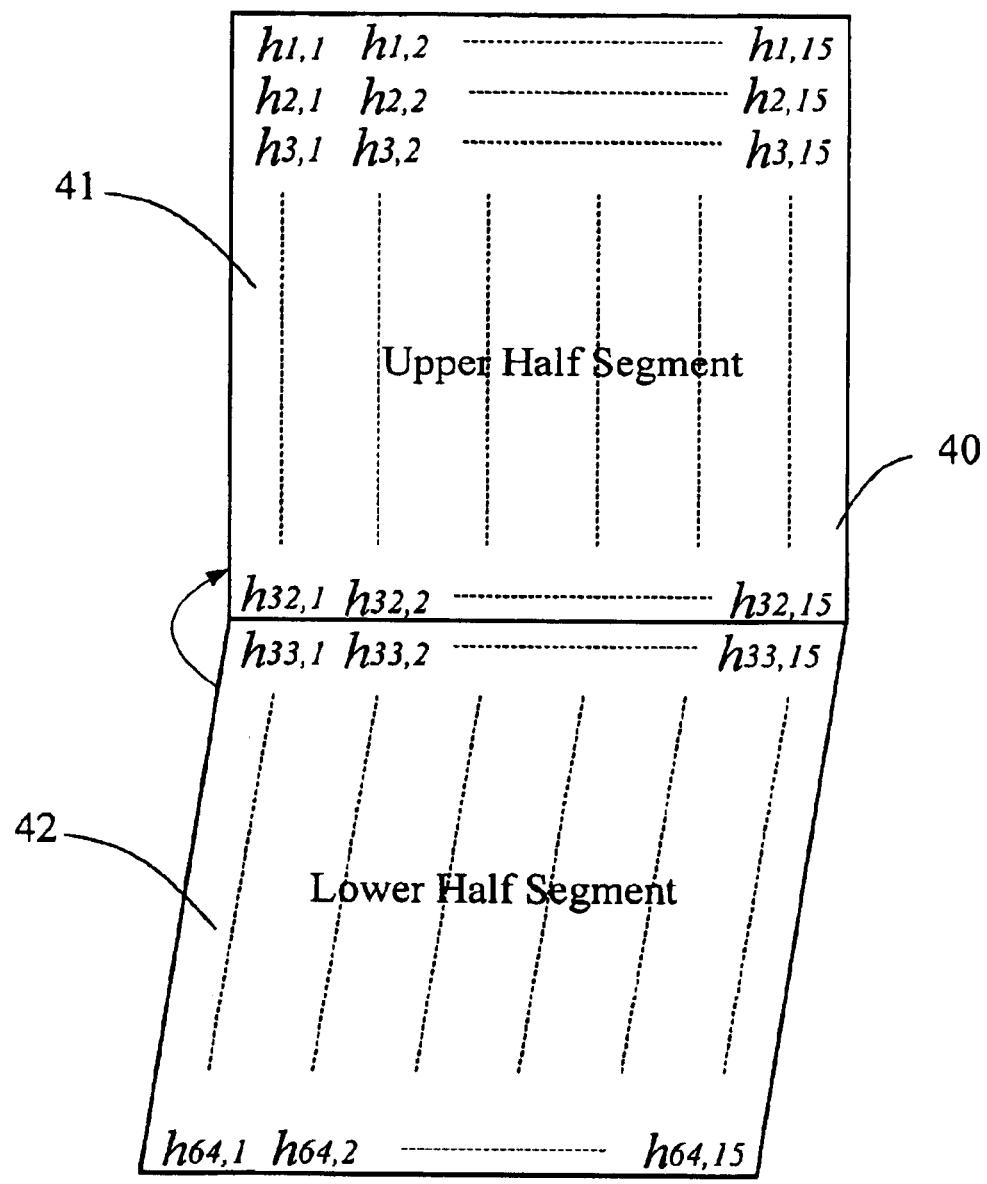
Figure 5C:
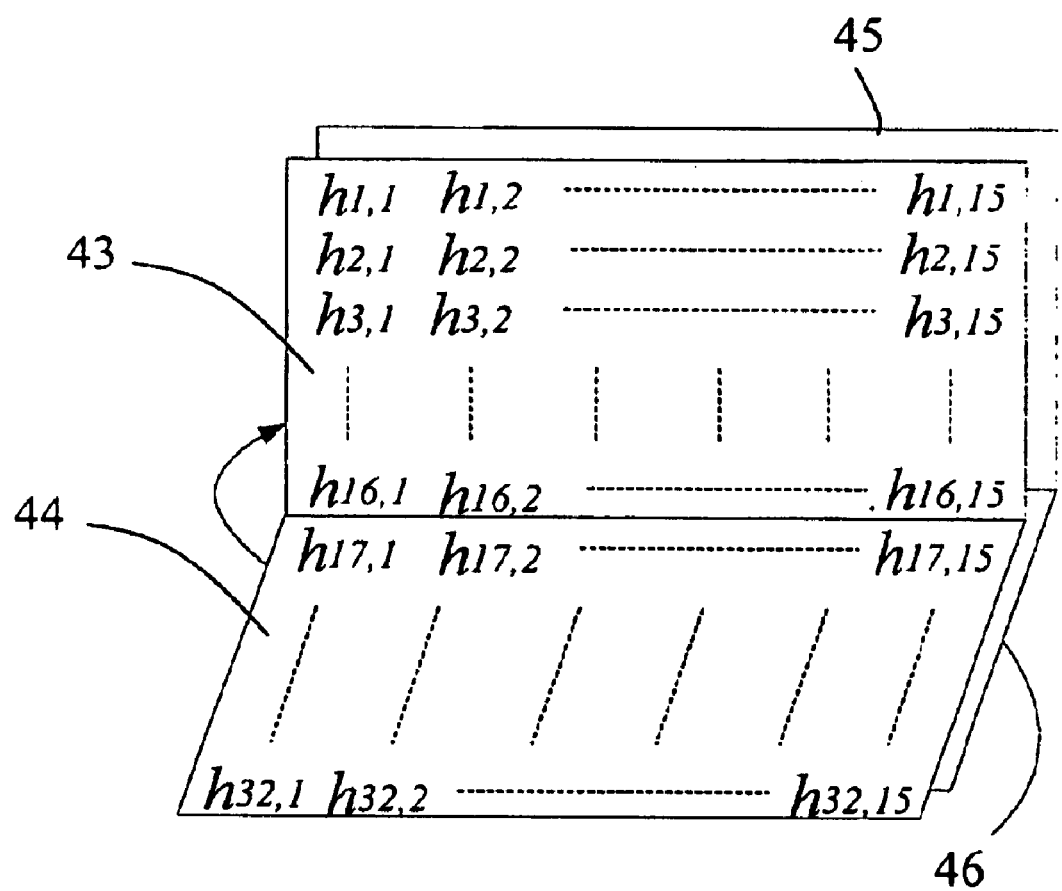
Figure 7:
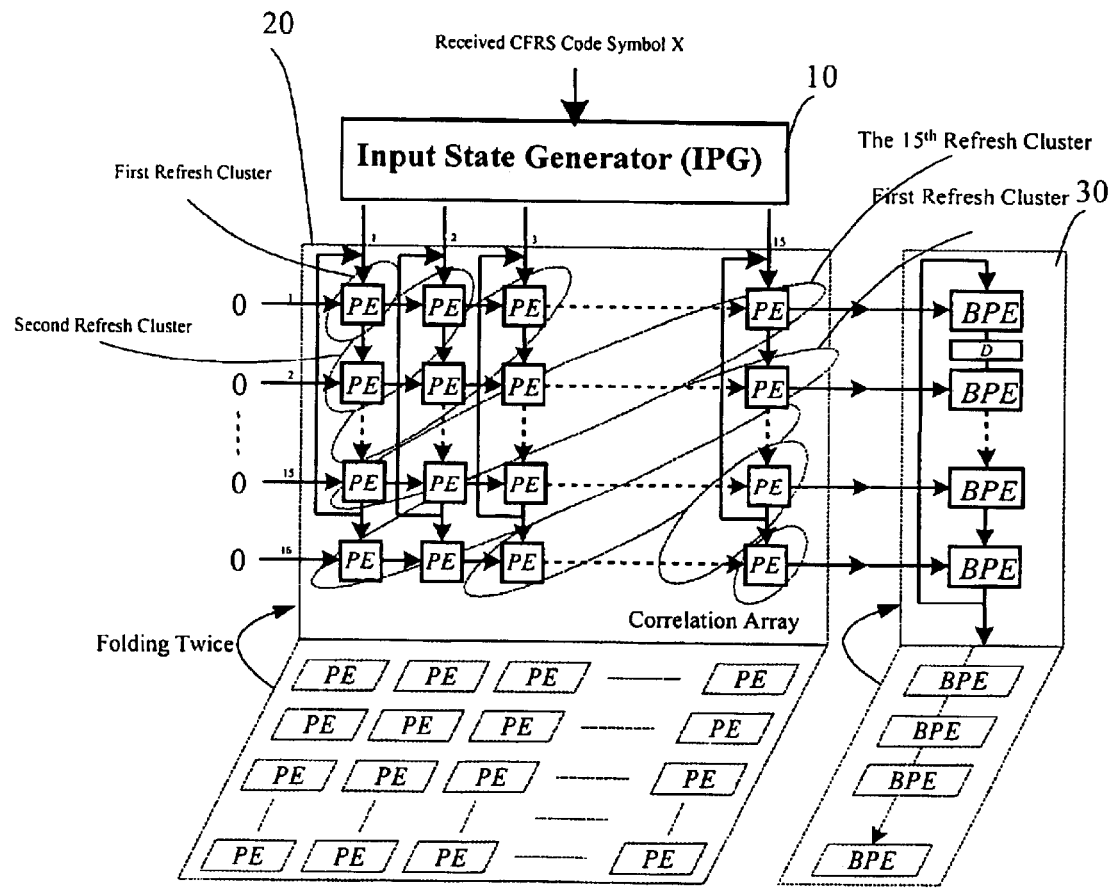
FIG. 7 shows a CFRS decoder based on the folding SA architecture; the number of times of folding is 2; the 64×15 array is reduced to a 16×15 one, but the decoding duration is still 94 cycles.

II. Folding Technology and the SA-based Decoding Circuit to which this Technology Applies With the folding technique put forward by the invention, the SA PE assignment of the PEA 20 of the decoding circuit based on a SA architecture is folded so that its array size is reduced from 64×15 to 32×15 and thus its area is reduced. The 64×15 CFRS code symbol table 40 (shown in FIG. 5A) is also folded and thus turned into a 32×15 table, as shown in FIG. 5B, comprising an upper half segment 41 and a lower half segment 42. Similarly, the 64×1 BPEA 30 PE assignment is also folded and thus turned into a 32×1 PE assignment. Despite the folding, a decoding speed of 94 cycles is maintained. The folding process impacts the decoding speed depending on the number of foldings. Explanation is herein provided for the folding technique in a case where, for example, folding is carried out twice successively. As shown in FIG. 7, after the PEA 20 PE assignment has been folded twice, its original 64×15 systolic array is diminished and turned into a 16×15 systolic array. The CFRS code symbol table that has to be saved beforehand for the PEA 20 is, by the same token, turned into four segments: the first segment 43, the second segment 44, the third segment 45 and the fourth segment 46, as shown in FIG. 5C.

The maximum number of foldings permitted without jeopardizing decoding speed is two. FIG. 7 shows the architecture that results from the folding, wherein the IPG 10 and each PE remain identical to their appearance shown in FIGS. 3 and 4, respectively, thus they need not be modified. However, the BPE has to be slightly modified so that its architecture is capable of feedback, as shown in FIG. 6.

After two foldings, the size of the PEA 20 is reduced from 64×15 to 16×15, while the size of the BPEA 30 is also reduced from 64×1 to 16×1, thus the areas of both arrays decrease to one-fourth of their original sizes. The reduction in array area is achieved at the cost of the addition of a "refresh mechanism" for refreshing the code symbol, $h_k$, stored beforehand in the H register of the PE. In other words, after two folds, the 64×15 CFRS code symbol table 40 originally stored in advance in the PEA 20 (shown in FIG. 5A) is divided into four segments 43, 44, 45 and 46, as shown in FIG. 5C. The first time, only one segment is placed in the H register of the PEA 20 shown in FIG. 7. The second time, one segment is saved first, then, after the previous segment has been decoded, the code symbol of the next segment is refreshed by the refresh mechanism and saved in the PE.

A refresh cluster is shown in FIG. 7, and code symbols are refreshed cluster by cluster. In other words, only one cluster is refreshed each time. The formation of clusters depends on the execution condition of the SA. After each PE has made a correlating comparison with the last code symbol it receives, it should immediately make a correlating comparison for the code symbol of the next segment in the next cycle. Hence, it is necessary to refresh the code symbol saved beforehand in individual PEs, that is, to refresh the content value in the H register. Since the execution of the SA is conducted in a hierarchical pipelined manner, PEs in individual rows must be refreshed, and the PEs are separated from each other by one position. All the PEs that have to be refreshed in the same cycle are collectively known as a refresh cluster. Clusters are refreshed in order, so that all the code symbols that are saved beforehand in 16 rows and are required to be refreshed can be refreshed simultaneously. There is a total of 15 refresh clusters and they are refreshed in sequence, or, in other words, every cluster is refreshed every 15 cycles.

Figure 8:
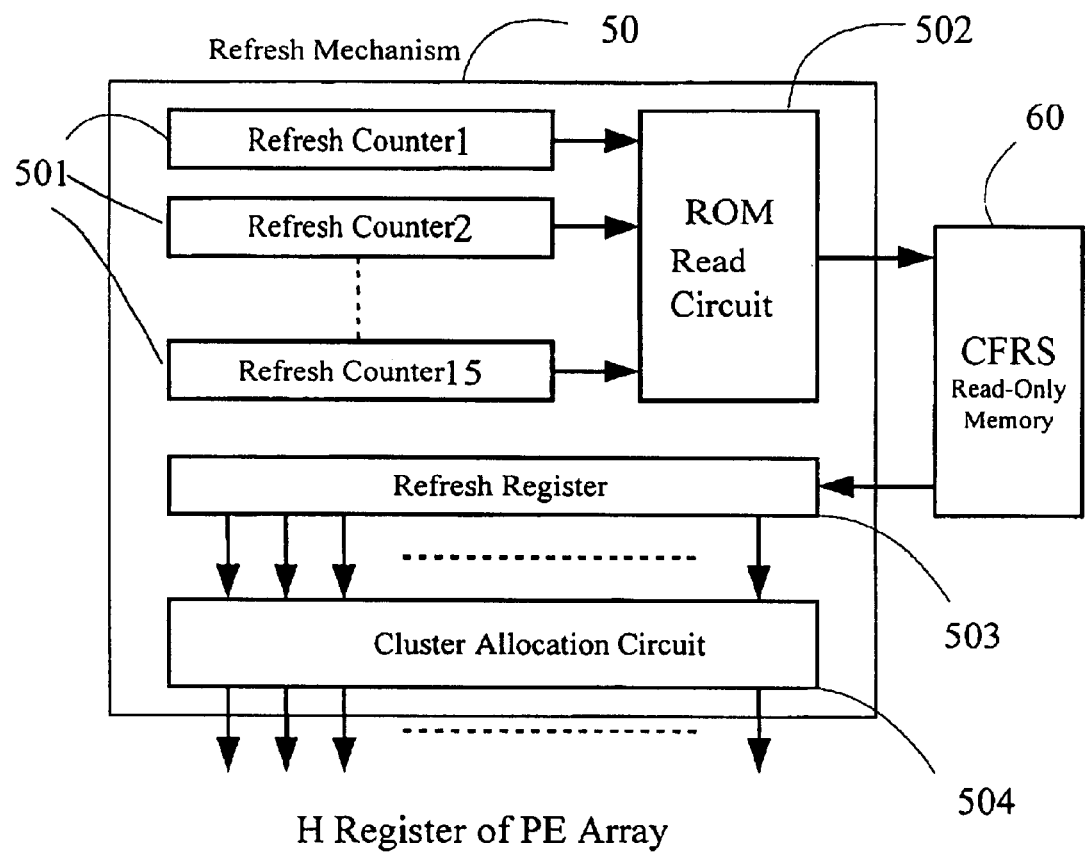
FIG. 8 depicts the circuit of a refresh mechanism.

FIG. 8 shows the refresh mechanism that comprises 15 refresh counters 501, a read circuit 502 of a Read-Only Memory (ROM) 60, a refresh register 503 and a cluster allocation circuit 504. The 15 refresh counters 501 measure the time taken to refresh individual refresh clusters. Once the refresh time runs out, the refresh counters 501 trigger the read circuit 502 of the Read-Only Memory (ROM) 60. The read circuit 502 then reads the code symbols of the next segment to be saved beforehand, and places the code symbols in the refresh register 503. The cluster allocation circuit 504 sends the new code symbols to the corresponding H registers of the PEs (for saving CFRS code symbols beforehand). This is the way the refresh procedure is executed. The CFRS Read-Only Memory (ROM) 60 shown in FIG. 8 is the ROM that saves the 64.times.15 CFRS code symbol table 40, as shown in FIG. 5A.

In addition, as shown in FIG. 7, the code symbol received and sent downward by the $15^{th}$ row of the PEA 20 has to be sent to the first row as feedback because, in the meantime, the second segment decoding has to be started in the first row. The direct feedback exempts IPG 10 from generating skewed input repeatedly whenever a new segment is to be decoded. As a result, power consumption is reduced.

Please refer to FIG. 7. The decoding process of the folding architecture is as follows: IPG 10 generates the 15 types of cyclic-shift of the received CFRS codes in order, and outputs these cyclic-shift results in a skewed form to the 16×15 PEA 20. In the meantime, the refresh mechanism loads and refreshes the code symbols of the first segment 43 shown in FIG. 5C according to the sequence of the refresh clusters. The PEA 20 makes a correlating comparison between these 15 cyclic-shift versions and the refreshed segment code symbols. A correlating comparison is made on a possible CFRS codes for each row. As regards the correlating comparison result of a row, the BPE of the row finds the most probable result of cyclic-shift version, searches vertically, that is, from top to bottom, and finds the most probable result of cyclic-shift of individual rows. The output of the BPE at the bottom is the decoding result for the first segment. This result has to be sent to the first BPE as feedback, and compared with the result of the next segment.

After the refresh procedure executed by the refresh mechanism on the first cluster and the lapse of the following 15 cycles, the correlating comparisons between the code symbols 43 of the first segment and the cyclic-shift of the received code symbols are completed. The code symbols 43 of the first segment have to be refreshed and turned into the code symbols 44 of the second segment, so that the third segment 45 and the fourth segment 46 can be refreshed by analogy. The process does not end unless and until the correlating comparisons of the fourth segment are completed. The output of the BPE at the bottom is the decoding result.

The process of mathematical calculation for the decoding of folding architecture is similar to that of the architecture previously put forward, except that the components in charge of execution are different. The 16×15 PEA 20 and the 15×1 BPEA 30 shown in FIG. 7 are repeatedly used. The concept of refreshing the codes saved beforehand and the concept of the refresh mechanism are incorporated into the design. As a result, the area of a decoder is reduced, but the decoding speed of the decoder is not. The decoding time required by the decoder remains the same, that is, 94 cycles.

III. Extension of Folding Technology

The above description is of the consequence of two foldings. The speedy decoding feature is retained, while the area of the decoder is reduced. It is feasible to apply the folding technology further, and fold a 16×15 PEA 20 in a symmetric manner, though its decoding duration increases with the number of times of symmetric folding. The size of the array decreases with the number of times of folding.

Table 1 shows the size of the array and the decoding duration with respect to different number of folds. When folding is carried out once or twice, the decoding duration is 94 cycles, though the sizes of their arrays differ by one time. Therefore, folding an array twice is the best option as it achieves an optimal balance. In the event that the decoding speed is unimportant, folding an array six times will lead to the smallest array area, that is, 1×15 PEA 20 and 1×1 BPEA 30, though the decoding duration becomes 975 cycles.

Since the circuit designs of individual folding versions are very similar, it is feasible to put several versions in the same circuit. Take the aforesaid two versions as an example. Two times of symmetric folding may be performed in the 16×15 PEA 20 and the 16×1 BPEA 30. As a result, decoding can be completed in 94 cycles, meeting the demand for speedy decoding in the cell search. When the cell search does not require a high decoding speed, it is feasible to use architecture that is folded 6 times, that is, the 1×15 PEA 20 and the 1×1 BPEA 30, and the decoding may be completed in 975 cycles. The advantage of folding the architecture 6 times is that its power consumption is reduced.

Given the aforesaid folding method, a circuit may work at different decoding speeds when the folding number varies, so that the flexibility in the design of cell search algorithms is greatly enhanced at the cost of a slight increase in the complexity of hardware.

IV Practical Testing

The decoding function and the decoding duration of the aforesaid 64×15, folding 16×15, and folding 1×15 architectures have been verified with Verilog Hardware Description Language. The aforesaid architectures are also syntheiszed by synthesis tools, such as Synopsys™, into gate-level circuits, so that the decoding function and the decoding duration of the aforesaid architecture are verified once more. Table 2 shows the gate-count of the components of different architectures. The decoding duration of both the 64×15 SA architecture and the 16×15 architecture that is folded twice is 94 cycles. The gate-count of their PEAs differ by four times because of the folding technique put forward herein. However, the gate-count of BPEA 30 merely differs from its counterpart by approximately three times because the BPE needs a greater gate-count after folding. With a refresh circuit, the total gate-count of a decoder of the folding architecture is reduced to a half of that of the 64×15 SA architecture.

Since the 1×15 architecture works together with the 16×15 architecture, the refresh circuit of the former is as complicated as that of the latter. In practice, it is feasible to adopt a simple ROM single-code-symbol read circuit that is also equipped with independent BPEs, as opposed to the aforesaid two types of architecture.

EFFECT OF THE INVENTION

The CFRS decoding circuit put forward by the invention is based on SA architecture. The decoding duration of the 64×15 array is 94 cycles. The 64×15 array may be reduced to a 16×15 array by means of the folding technique put forward by the invention. Its speedy decoding feature is retained—it still takes 94 cycles, though an additional refresh circuit is required. The folding technique may be extended. On the premise of meeting the demand for decoding in the cell search algorithms, an array is folded several times, reducing the number of components required for execution and thus minimizing power consumption. Another option of folding technique extension is to have several types of folded decoding architecture in the same circuit. For example, given an additional special BPE, when a 1×15 architecture is added to a 16×15 architecture, a CFRS decoder works in a multi-mode manner and thus is able to support various decoding speeds, meeting the various needs of different types of cell search algorithms.

While the invention has been described by way of example and in terms of a preferred embodiment, it is to be understood that the invention is not limited thereto. It should be understood that the detailed description and specific examples, while indicating preferred embodiments of the invention, are given by way of illustration only, since various changes and modifications within the spirit and scope of the invention will become apparent to those skilled in the art from this detailed description. Therefore the scope of protection for the invention should conform to the claims attached below.

What is claimed is:

1. A folding systolic architecture for a Comma-Free Reed-Solomon decoding circuit, comprising:

an input pattern generator, which receives the arbitrarily cyclic-shift CFRS codes, for generating 15 cyclic-shift versions of the CFRS codes to output in a skewed form to a systolic array;

a plurality of processing element assignments folded at least one time compared to a systolic array composed of 64×15 processing elements, for receiving the skewed-form CFRS codes, to make correlating comparisons and output a set of correlating comparison results;

a plurality of boundary processing element assignments folded at least one time compared to a systolic array composed of 64×1 boundary processing elements, for calculating the greatest correlating comparison result of each row of said systolic array to find the greatest row result and set a corresponding index as a decoding result; and a refresh mechanism for refreshing a code symbol saved in advance in each said processing element.

2. The folding systolic architecture for a Comma-Free Reed-Solomon decoding circuit of claim 1, wherein:

the number of foldings for the systolic array architecture compared to said 64×15 processing elements and the systolic array architecture compared to the 64×1 boundary processing elements is two.

3. The folding systolic architecture for a Comma-Free Reed-Solomon decoding circuit of claim 1, wherein:

said input pattern generator is composed of a shift register, a Johnson counter and a masking combinational circuit;

said shift register receives the 15 symbols of said CFRS codes, cyclically shifts them and outputs them as 15 cyclic-shift versions of said CFRS codes;

said Johnson counter sends a masking signal to said masking combinational circuit; and said masking combinational circuit outputs the skewed-form CFRS codes for said systolic array according to said masking signal.

4. The folding systolic architecture for a Comma-Free Reed-Solomon decoding circuit of claim 1, wherein:

each of said processing elements is composed of a first register, a second register, a third register, a combinational circuit (XNOR-AND) and an accumulator;

said first register stores the symbols of the CFRS codes beforehand;

said second register stores the received code symbols of said CFRS codes to facilitate their decoding;

said third register stores a result of said correlating comparison results;

said (XNOR-AND) combinational circuit compares two code symbols in said first register and said second register, respectively, to see whether they are identical; and said accumulator adds the comparison result to a final result.

5. The folding systolic architecture for a Comma-Free Reed-Solomon decoding circuit of claim 1, wherein:

each of said boundary processing elements is composed of a first comparator, a second comparator and a combinational circuit;

said first comparator compares the comparison results of the same row, while said second comparator compares the comparison results of different rows; and said combinational circuit stores temporary results of said first comparator and those of said second comparator, and sends the comparison result of said row to said second comparator for comparison after said first comparator has made a comparison with respect to said row.

6. The folding systolic architecture for a Comma-Free Reed-Solomon decoding circuit of claim 1, wherein:

said refresh mechanism is composed of a plurality of counters, a read circuit of Read-Only Memory (ROM), a refresh register and a cluster allocation circuit;

said plurality of counters figure out the time taken to refresh individual refresh clusters in a duration of figuring out 15 refresh clusters;

once the refresh time runs out, said read circuit of ROM read the code symbol of the next segment to be saved beforehand, and place the code symbol in said refresh register;

said cluster allocation circuit then sends the new code symbol to said first register of said corresponding processing element for saving said CFRS code symbol beforehand to complete the refresh procedure;

the formation of said 15 refresh clusters depends on the execution condition of said systolic array.

* * * * *